United States Patent [19]
O'Neil, II

[11] Patent Number: 4,687,957
[45] Date of Patent: Aug. 18, 1987

[54] FIBER OPTIC TRANSCEIVER

[75] Inventor: Vernon P. O'Neil, II, Tempe, Ariz.

[73] Assignee: Motorola, Inc., Schaumburg, Ill.

[21] Appl. No.: 371,141

[22] Filed: Apr. 23, 1982

[51] Int. Cl.⁴ .................. H03K 3/42; G06G 7/12; H01L 31/14
[52] U.S. Cl. ..................... 307/311; 307/490; 250/552
[58] Field of Search ............ 307/311, 490, 296 R; 328/6; 250/552

[56] References Cited
U.S. PATENT DOCUMENTS
4,031,417  6/1977  Werner ..................... 307/311

OTHER PUBLICATIONS
D.C. Voltage Switch by P. Debord, IBM Tech. Disclosure Bulletin, vol. 19, No. 10, Mar. 1977, pp. 3754 and 3755.

Primary Examiner—Stanley D. Miller
Assistant Examiner—B. P. Davis
Attorney, Agent, or Firm—Joe E. Barbee; Paul F. Wille

[57] ABSTRACT

A half-duplex transceiver circuit is disclosed in which a single diode acts as both the light emitter and the light detector. The diode is connected in parallel with a junction in an associated device. The forward voltage drop across the diode exceeds the forward voltage drop across the junction.

7 Claims, 1 Drawing Figure

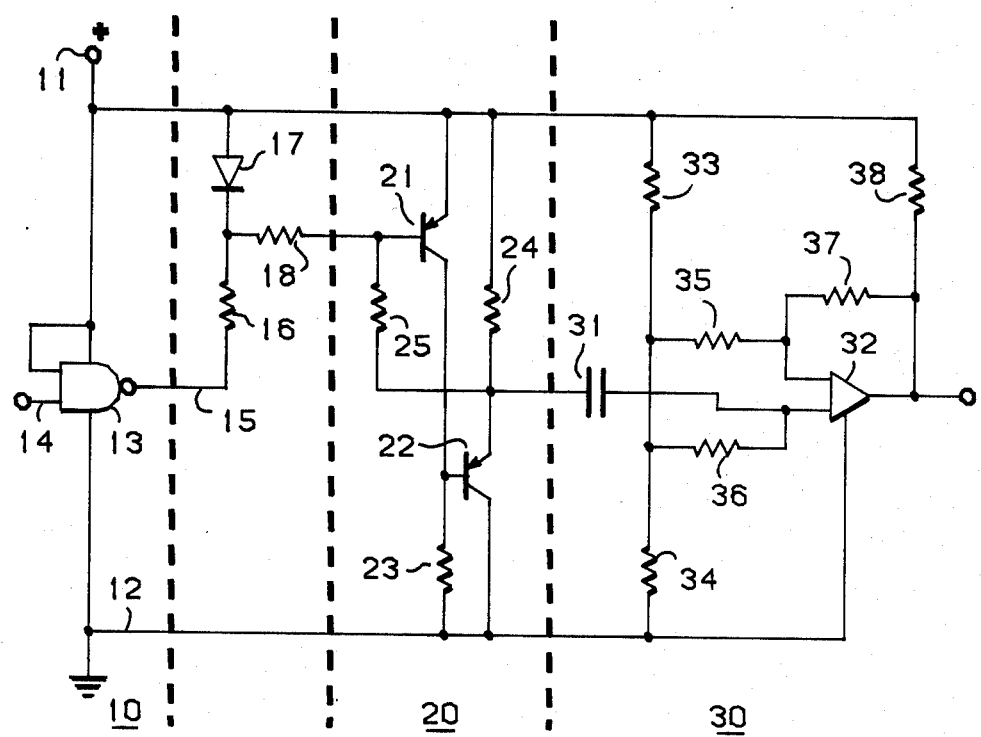

4,687,957

FIBER OPTIC TRANSCEIVER

BACKGROUND

This invention relates to transceiver circuits and, in particular, to a half-duplex transceiver using a light emitting diode (LED).

In the past, optical transceiver circuits have used separate emitters and detectors and a pair of optical fibers. In systems where substantial lengths of optical fiber is used, directional couplers are employed to enable use of a single fiber. In either event, the cost of such systems is substantial.

There are many applications in which two way communication is desired over relatively short distances at low cost; for example, within vehicles, homes, factories, and offices. In these applications, cost rather than optical performance becomes the prime consideration, particularly as the number of communication paths increases. Optical performance is not a prime consideration since the relatively short distance, eg. less than one kilometer, does not require high output power, extremely low loss cable, or high sensitivity detectors.

In such applications, it would also be advantageous to provide communication over a single fiber, particularly where it is desired to improve an existing system by substituting two-way communication for one-way communication or where one wants to double the number of existing two-way channels.

In view of the foregoing, it is therefore an object of the present invention to provide a low cost, optical transceiver.

Another object of the present invention is to provide an optical transceiver using a single device for both emission and detection.

A further object of the present invention is to provide a half-duplex optical transceiver.

SUMMARY

The foregoing objects are achieved in the present invention where there is provided a light emitting diode, a driver circuit for switching current through the diode to cause the diode to emit light, and a detector circuit also connected to the diode for detecting current generated by the diode when light is incident thereon. The detector circuit contains a semiconductive device having a junction coupled in parallel with the diode. The junction has a forward voltage drop which is less than the forward voltage drop across the diode.

As used herein, "light" refers to electromagnetic radiation to which semiconductor materials, eg. silicon, gallium arsenide, are or can be made sensitive, whether or not such radiation is visible to the unaided human eye.

A more complete understanding of the present invention can be obtained by considering the following detailed description in conjunction with the accompanying drawing, in which:

The FIGURE illustrates a preferred embodiment of the present invention in a form suitable for use in present digital circuits.

As illustrated in the FIGURE, the optical transceiver in accordance with the present invention comprises a driver stage 10 coupled to a single LED which is also coupled to the input of a sense circuit comprising a current to voltage converter 20 and a voltage level converter 30. Specifically, the optical transceiver comprises a power bus comprising a pair of conductors 11 and 12 each connected to a source of reference voltage, for example, plus five volts and ground, respectively. Driver 10 in this embodiment comprises an open collector NAND circuit having one input 14 as the input to the transceiver and a second input connected to bus 11. Output 15 of driver circuit 10 is coupled by way of resistor 16 to the cathode of light emitting diode 17. The anode of light emitting diode 17 is connected to bus 11. The cathode of diode 17 is coupled by way of resistor 18 to the input of current-to-voltage converter 20.

Current-to-voltage converter 20 preferably comprises what is known in the art as a trans-impedance amplifier. Specifically, converter 20 comprises a first transistor 21 having the emitter thereof connected to bus 11 and the base thereof connected to resistor 18. The collector of transistor 21 is connected to the base of transistor 22. The collector of transistor 22 is connected to bus 12. The emitter of transistor 22 is connected by way of load resistor 24 to bus 11. The collector of transistor 21 and the base of transistor 22 are connected to bus 12 by way of resistor 23. Thus, transistor 21 acts as a current amplifier and transistor 22 acts as an emitter follower. The output from converter 20 is taken from the emitter of transistor 22 and coupled by way of capacitor 31 to level converter 30. Also connected to the output of converter 20 is feed-back resistor 25 which is connected from the emitter of transistor 22 to the base of transistor 21.

Level converter 30 acts as a voltage comparator and produces an output signal indicative of whether or not the input signal thereto is greater than or less than a predetermined voltage. Specifically, level converter 30 comprises resistors 33 and 34 series connected between buses 11 and 12 to form a voltage divider. Connected to the tap on the voltage divider are coupling resistors 35 and 36 which are connected one each to the inputs of amplifier 32. One input of amplifier 32 is connected to coupling capacitor 31 for receiving the signal from current-to-voltage converter 20. The output of amplifier 32 is connected to bus 11 by way of load resistor 38. The output of amplifier 32 is also connected to the other input thereof by way of feedback resistor 37.

As thus described, it can be seen that diode 17 is coupled in parallel (i.e. not anti-parallel) with the emitter base junction of transistor 21. The forward voltage drop across diode 17 must exceed the forward voltage drop across the PN junction between the emitter and base of transistor 21. The reason for this will be apparent upon considering the operation of the transceiver circuit.

In operation, assuming a low (logic zero) level signal at input 14, output 15 of driver 10 is high. Thus, no current can flow through diode 17 to driver 10 and diode 17 does not emit light. Current-to-voltage converter 20 is in a quiescent state as determined by the biasing provided by transistors 23, 24 and 25. Light incident upon diode 17 causes the generation of a small current therein which is coupled by way of resistor 18 to the input of converter 20. This small current is amplified by transistor 21 which, in so doing, upsets the quiescent state of converter 20. The change in current through transistor 21 is converted to a change in the voltage drop across resistor 23 which, in turn, changes the bias signal applied to the base of transistor 22. This voltage change is followed by transistor 22 and coupled back to the base of transistor 21 by way of feed-back resistor 25. The magnitude of the voltage change is determined by the base current through transistor 21 times the resistance of feed-back resistor 25.

This voltage change is coupled to a level converter 30 and is sufficient to cross the predetermined threshold of converter 30. The output of amplifier 32 is thus a pulse indicative of a pulse of light received by diode 17. The output signal of amplifier 32 is coupled back to the other input thereof to adjust the threshold which must be crossed by the first input thereby enabling amplifier 32 to track the input signal from current to voltage converter 20.

Since the forward voltage drop across the emitter base junction of transistor 21 is lower than the forward voltage drop across diode 17, the operation of the sense circuitry does not cause diode 17 to turn on and emit light.

In the event a pulse (a logic one) is applied to input 14, output 15 is brought to a voltage very nearly equal to the voltage on bus 12. Current therefore flows through diode 17 and coupling resistor 16, causing diode 17 to emit light. This signal is also coupled to the sense circuitry which treats it as an input from diode 17. The peripheral circuitry associated with the transceiver may either use this signal as a verification of the outgoing data or can simply ignore the signal from amplifier 32 while diode 17 is emitting light. Thus the transceiver circuit in accordance with the present invention operates in a half duplex load.

The present invention can be implemented using the following commercially available devices. This implementation is by way of example only and is not intended as limiting.

| Resistors: | 16 | 68 Ω |
|---|---|---|
| | 18, 23, 36 | 10K Ω |
| | 24, 38 | 2.2K Ω |
| | 25 | 100K Ω |
| | 33, 34, 35 | 1K Ω |
| | 37 | 300K Ω |
| Capacitor | 31 | 500 pf |
| Driver | 13 | (¼) MC75432p |
| Amplifier | 32 | LM311N |
| Transistor | 21, 22 | MPS A70 |
| Diode | 17 | MFOE 106F |

There is thus provided by the present invention a low cost transceiver suitable for use over relatively short distances. The complex switching circuitry as used in the prior art are obviated and one is enabled to communicate bi-directionally over a single optical fiber transmission line.

Having thus described the invention, it will be apparent to those with skill in the art that various modifications can be made within the spirit and scope of the present invention. For example, driver 10 can simply comprise a transistor having its collector connected to output 15, its base connected to input 14 and its emitter to bus 12. While described with devices of a particular polarity, the polarity of the buses can be reversed and complementary devices used in implementing the present invention. While described as a circuit employing discrete devices, the transceiver of the present invention can be incorporated into a single integrated circuit. Also, one may prefer to eliminate coupling capacitor 31 and provide DC coupling throughout the circuit.

I claim:

1. An optical transceiver circuit comprising:
   a single light emitting diode;
   a driver coupled to said diode for causing a drive current to flow discontinuously through said diode, said diode emitting light in response to said drive current; and
   a sense circuit coupled to said diode for detecting current generated by said diode when said drive current is not flowing through said diode and light is incident upon said diode.

2. The optical transceiver circuit as set forth in claim 1 wherein said sense circuit comprises a P-N junction at the input thereof, said PN junction having a forward voltage drop less than that of said diode.

3. The optical transceiver circuit as set forth in claim 2 wherein said diode and said junction are coupled in parallel.

4. The optical transceiver circuit as set forth in claim 3 wherein said sense circuit comprises a current to voltage converter.

5. The optical transceiver circuit as set forth in claim 4 wherein said current to voltage converter comprises a transimpedance amplifier.

6. The optical transceiver circuit as set forth in claim 4 wherein said sense circuit comprises a voltage level converter connected to said current to voltage converter.

7. The optical transceiver as set forth in claim 6 wherein said voltage level converter comprises a comparator having a first input connected to said current to voltage converter and a second input connected to a source of reference potential.

* * * * *